(12) United States Patent
Dang

(10) Patent No.: US 8,791,736 B2
(45) Date of Patent: Jul. 29, 2014

(54) ADJUSTABLE POLE AND ZERO LOCATION FOR A SECOND ORDER LOW PASS FILTER USED IN A PHASE LOCK LOOP CIRCUIT

(71) Applicant: Yen Dang, San Jose, CA (US)

(72) Inventor: Yen Dang, San Jose, CA (US)

(*) Notice: Subject to any disclaimer, the term of this patent is extended or adjusted under 35 U.S.C. 154(b) by 0 days.

(21) Appl. No.: 14/195,800

(22) Filed: Mar. 3, 2014

(65) Prior Publication Data
US 2014/0184287 A1    Jul. 3, 2014

Related U.S. Application Data

(62) Division of application No. 13/666,120, filed on Nov. 1, 2012, now Pat. No. 8,723,567.

(60) Provisional application No. 61/554,028, filed on Nov. 1, 2011.

(51) Int. Cl.
H03L 7/06 (2006.01)
H03K 5/00 (2006.01)

(52) U.S. Cl.
USPC ............. 327/156; 327/552; 327/558; 331/17; 375/376

(58) Field of Classification Search
CPC ........................................................ H03L 7/093
USPC .................. 327/147, 148, 156, 157, 551–559; 331/17; 375/373–376
See application file for complete search history.

(56) References Cited

U.S. PATENT DOCUMENTS

| | | | |
|---|---|---|---|
| 6,344,772 B1* | 2/2002 | Larsson | 327/552 |
| 7,292,077 B2* | 11/2007 | Liu | 327/156 |
| 7,466,175 B2* | 12/2008 | Smith et al. | 327/156 |
| 7,501,901 B2* | 3/2009 | Hjelm | 331/16 |
| 7,567,133 B2* | 7/2009 | Caplan | 331/17 |
| 7,649,408 B2* | 1/2010 | Liu et al. | 327/558 |
| 7,755,437 B2* | 7/2010 | Ballantyne et al. | 331/17 |
| 2007/0090872 A1* | 4/2007 | Chen et al. | 327/552 |

* cited by examiner

Primary Examiner — Patrick O'Neill
(74) Attorney, Agent, or Firm — Fang Wu

(57) ABSTRACT

This invention provides a loop filter device and a method for IC designers to adjust the pole or zero location of a phase lock loop (PLL) circuit. The pole and zero location are controlled by an amplifier and some on-chip resistor and capacitor components. The effective capacitance is magnified by the gain of the amplifier. The advantage of the loop filter device and the method according to embodiments of the present invention provides a feasible way to achieve a very low bandwidth in the PLL circuit without a huge external surface-mount capacitor.

12 Claims, 10 Drawing Sheets

ADJUSTABLE POLE AND ZERO LOCATION FOR A SECOND ORDER LOW PASS FILTER USED IN A PHASE LOCK LOOP CIRCUIT

CROSS-REFERENCES TO RELATED APPLICATIONS

This application is a divisional application of U.S. patent application Ser. No. 13/666,120, filed Nov. 1, 2012 by Yen Dang, and claims priority to U.S. provisional application No. 61/554,028, filed Nov. 1, 2011, by Yen Dang, and hereby incorporated by reference in its entirety herein for all purposes.

BACKGROUND OF THE INVENTION

The present invention relates generally to circuit design technology. More particularly, the present invention provides a circuit structure functioning as a filter device capable of tuning loop zero and pole frequency by adjusting the gain of an amplifier. Merely by way of example, the present filter device is applicable in phase lock loop circuit characterized by tunable pole and zero locations with reduced on-die real estate for superior low-bandwidth application, but it would be recognized that the invention may have many other integrated circuit applications.

In modern integrated circuit (IC) chip design, Phase Lock Loop (PLL) is a very common circuit that is widely used. It is used to multiply the frequency of an external reference clock to a different frequency range which the chip needs. It can also synchronize internal chip clock with the input reference clock. The PLL is used in many different applications such as frequency synthesizer, on chip clock generator, clock data recovery circuit and some wireless applications. PLL receives one external reference clock and generates different frequency clocks for internal chip use.

There are many electrical specifications for PLL designers to meet during circuit design. Bandwidth of the PLL is a major design parameter. Sometimes, it is desirable to make the bandwidth of the PLL in a range of 10 kHz to 100 kHz, or even less than 1 kHz depending on application, to reject the incoming noise from the reference clock. However, for such a low bandwidth, it requires a huge on die capacitor that is impossible to bear.

FIG. 1 is a traditional analog PLL block diagram which includes phase-frequency detector (PFD) 101, charge pump circuit (CP) 103, loop filter 105, voltage control oscillator (VCO) 107 and frequency divider (FD) 109. Phase-frequency detector compares an external reference clock and a feedback clock from the divider. It generates an error signal to the charge pump to correct this error. Charge pump will either charge up or charge down the loop filter. Output of the loop filter will change the VCO output frequency that will reduce the error. At a final balance state, the feedback clock and the reference clock have the same frequency and phase.

FIG. 1A shows an exemplary circuit of the loop filter 105 in FIG. 1. It is a second order filter determined by the number of the capacitors, i.e., two in this case. There is one zero and two poles in this filter. In general, the second pole is far away comparing to the first pole. Therefore, the dominant pole location is determined by C200. There is also one zero formed by R100 and C200. This zero point is in general at lower frequency than the pole generated by C2 (or C201). The area of C1 is very big in order to have a lower frequency zero, resulting in many packaging inconvenience in IC chip applications.

FIG. 2 is a diagram showing an improved PLL circuit which reduces the capacitor area. This circuit is an improved version of the previous circuit with a reduced capacitor area. It has one additional charge pump circuit comparing to the traditional PLL circuit as in FIG. 1. The charge pump 211 works opposite to the charge pump 203. When the charge pump 203 charges up the loop filter 205, charge pump 211 discharge capacitor C1 of the loop filter 205, and vice versa. The current flowing through the capacitor C1 is reduced, and the needed capacitance value of the C1 is thus reduced. However, the Phase Lock Loop in FIG. 2 has a disadvantage. Mismatch between the two charge pumps limits the effectiveness of the circuit. The charge pump itself also takes area in IC packaging.

FIG. 3 is a diagram showing another improved PLL circuit. It uses Miller effect to boost up the effective capacitance. The amplifier 311 is added for increasing the capacitance of C1 about K times higher than the physical C1 capacitance, where K is the gain of the amplifier and the nominal size of dominant pole capacitor, C1, is about 50 pF to 400 pF.

FIG. 3A is a detail diagram showing an exemplary implementation of the loop filter 305 in FIG. 3. This structure has some inherit problems. First, the DC voltage of Node 400 can vary from ground to power. It can turn off device M1 if DC bias is not correct. Second, bias current $I_c$ needs to be properly adjusted so that both device M1 and M2 stays in saturation region to maintain the gain of the amplifier. Third, this device is a single stage single input amplifier with very limited gain K, for example, K is normally just around 10 or so.

It is seen that improved techniques for advanced PLL circuit design for low bandwidth application with improved frequency signal feedback control, and reduced chip area are highly desired.

BRIEF SUMMARY OF THE INVENTION

The present invention is directed to a Phase Lock Loop circuit that includes a loop filter capable of tuning loop zero and pole frequency by adjusting the gain of the amplifier. This invention also has an advantage to provide small on-die area particularly related to the loop filter in the PLL circuit. In particular, embodiments also provide methods for IC designers to use this loop filter for adjusting the pole and zero location of the PLL which affects the bandwidth. The pole and zero location are controlled by an amplifier and some on-chip R, C components within the loop filter. The effective capacitance will be magnified by the gain of the amplifier. The advantage of the filter device and the method according to embodiments of the present invention provides a much superior way to achieve a low bandwidth PLL without using a huge on-die capacitor.

In a specific embodiment, the present invention provides a loop filter capable of tuning zero location in PLL circuits. The loop filter includes an amplifier having a tunable gain, a capacitor, a first resistor and a second resistor. The capacitor forms a dominant loop pole of the loop circuit. A combination of the first resistor, the second resistor and the capacitor decides the loop zero frequency. Another combination of the amplifier, the second resistor and the capacitor forms a feedback circuit that can modify an effective resistor value seen at an input node of the loop filter and then shift the loop zero frequency to a designed value. In particular, the effective resistor value is a sum of the first resistor value and the second resistor value times the gain of the amplifier. The gain of the amplifier is tuned by adjusting a bias current inside the amplifier.

In another specific embodiment, the present invention provides a loop filter capable of tuning pole location and reducing bandwidth in a PLL circuit. The loop filter includes a resistor, a first capacitor, three second capacitors having a same capacitance value, an amplifier having a tunable gain, a first switch and a second switch, and a DC bias circuit. The first capacitor forms a dominant pole of the loop circuit. The resistor is coupled the first capacitor, deciding the zero frequency. A combination of the amplifier, the first capacitor, and the resistor forms a feedback circuit that can shift the pole location by changing the gain of the amplifier. In an embodiment, due to the Miller effect, an effective capacitance value of the first capacitor is magnified by the gain of the amplifier which is a differential amplifier with two input terminals and one output terminal. DC bias voltages of the two input terminals are set up by the first switch and the second switch respectively via a DC bias circuit. During an operation of the PLL circuit, the DC bias voltages of the two input terminals of the amplifier remain the same and un-changed even a DC voltage at an input node of the loop filter varies, allowing the amplifier to operate in a fixed DC operating point with the gain tunable up to 40 dB to 80 dB. Both the first switch and the second switch turn on when a reference clock is at ground voltage and turn off when the reference clock is at high voltage. AC input signals for the amplifier are coupled from the three second capacitors which are coupled to an output node of a charge pump which is also the input node of the loop filter. The amplifier is coupled with the first capacitor to form a Miller capacitor, effectively increasing the capacitor value by the gain of the amplifier and thus reducing the bandwidth of the PLL circuit.

In a specific embodiment, the present invention provides a passive filter device of any order configured for using a feedback mechanism to adjust pole and zero location to a predetermined frequency.

In an embodiment, the filter device is configured with a feedback mechanism including a functionality of adjusting the bandwidth to a very low frequency without need of a substantially large capacitor in a phase lock loop circuit. In an embodiment, the bandwidth associated with the PLL circuit can be reduced by 2 orders of magnitude comparing to that in convention PLL circuits. In certain implementations, the very low frequency referred to the PLL bandwidth is ranged from 1 kHz to 100 kHz for an analog phase lock loop circuit. In another embodiment, the bandwidth frequency can be even less than 1 kHz for an analog PLL circuit. The corresponding low bandwidth PLL circuit is free from an external discrete large value resistor or capacitor component on board.

In another embodiment, the filter device is configured to have the pole and/or zero location adjusted by a gain parameter of an amplifier.

In yet another embodiment, the filter device is configured to have the gain parameter of the amplifier adjusted to maintain a stability factor of a phase lock loop circuit within a predetermined range. The amplifier is a two-input one-output OpAmp.

DETAILED DESCRIPTION OF THE INVENTION

The present invention relates generally to circuit design technology. More particularly, the present invention provides a circuit structure functioning as a filter device capable of tuning loop zero and pole frequency by adjusting the gain of an amplifier. Merely by way of example, the present filter device is applicable in phase lock loop circuit characterized by adjustable pole and zero locations with reduced real estate for superior low-bandwidth application, but it would be recognized that the invention may have many other integrated circuit applications.

Embodiments of this invention provide a loop filter device and a method for IC designers to adjust the pole and zero location in the phase lock loop (PLL) circuit which affects the bandwidth. The pole and zero location are tuned by an amplifier and some on-chip resistor R, capacitor C components associated with the loop filter device. The effective capacitance can be magnified by the gain of the amplifier. The advantage of the loop filter device and the method according to embodiments of the present invention provides a feasible way to achieve a very low bandwidth in the PLL circuit without a huge external surface-mount capacitor.

The invention provides a PLL circuit including at least the following on-chip components. A first set of components includes one or more operational amplifiers (OpAmp). For example, a two-input one-output OpAmp. A second set of components includes one or more capacitors. A third set of components includes one or more resistors. Depending on the phase locking orders required by the chip designer for specific applications, the number of capacitors and resistors can be varied.

Figure 4:
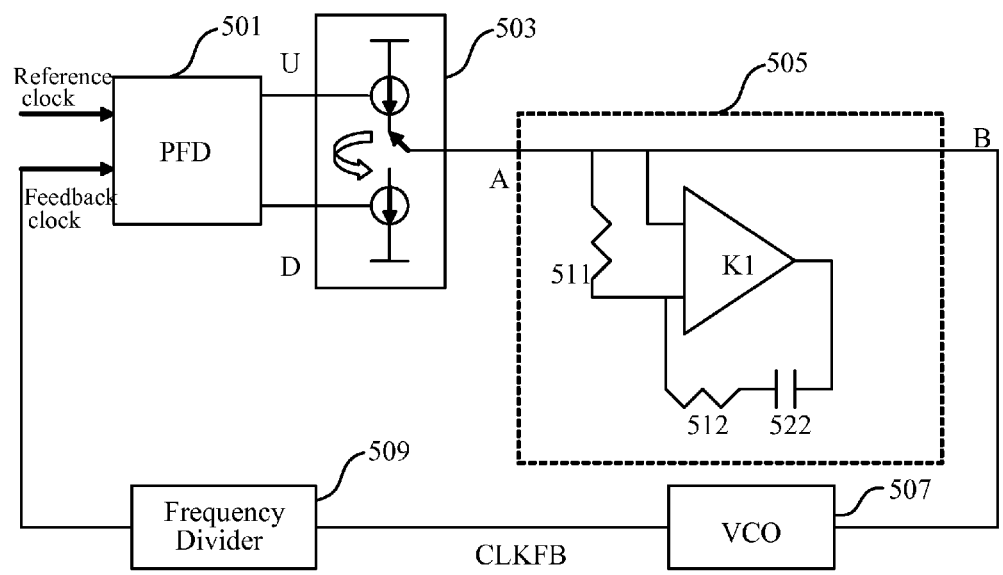
FIG. 4 is a circuit diagram of a PLL circuit with tunable zero frequency in a loop filter according to an embodiment of the present invention.

FIG. 4 is a circuit diagram of a PLL circuit with tunable zero frequency in a loop filter according to an embodiment of the present invention. This diagram is merely an example, which should not unduly limit the scope of the claims herein. One in ordinary skilled of the art should recognize many alternatives, variations, and modifications. A phase lock loop (PLL) circuit is provided, including a phase-frequency detector (PFD), a charge pump (CP), a loop filter (LF), a voltage controlled oscillator (VCO), and a frequency divider (FD). The PFD receives an external reference clock and a feedback signal and determines the frequency and phase error. PFD then sends out an error signal to the CP. The CP converts this voltage signal to a current signal and sends to LF. The LF filters out this signal and then converts it back to a voltage. A VCO is coupled to the LF receiving this voltage signal and outputs a high frequency signal according to this controlled voltage. The FD is coupled to the VCO then divides down this frequency and sends it to the PFD.

According to an embodiment of the present invention, as shown in FIG. 4, a loop filter 505 having an input node (A) and an output node (B) includes at least the following components: an amplifier K1, a capacitor 522, two resistors 511 and 512. Component 522 forms a dominant pole frequency of the loop circuit. Components 511, 512 and 522 decide the loop zero frequency. Amplifier K1, resistor 512 and capacitor 522 form a feedback circuit that can modify the effective resistor value seen at the input node A. The effective resistor value is the sum of resistor 511 and resistor 512 times the gain of the amplifier K1. The gain of the amplifier K1 is controlled by an adjustable bias current inside the amplifier, where a smaller bias current normally increases the gain of the amplifier. This mechanism can then shift the loop zero frequency to a designed value. Of course, there are many variations, alternatives, and modifications. More detailed descriptions about the operation of the loop filter 505 within a phase lock loop (PLL) circuit are presented below.

Referring to FIG. 4, a phase-frequency detector PFD 501 receives an external reference clock and a feedback clock. The PFD compares the two signals and then sends an output signal to the charge pump CP circuit 503. CP 503 either charges up or charges down the input node A of the present invention of loop filter LF 505. The loop filter 505 is configured to convert a current signal to a voltage signal. Output of the loop filter 505 at the output node B is connected to a voltage control oscillator VCO 507. Output of VCO 507 is coupled to a frequency divider 509. Output of the frequency divider 509 is then connected to the PFD 501.

The phase frequency detector 501 compares the external reference clock and the feedback clock received from the frequency divider 509. If the phase of the feedback clock leads the phase of the reference clock, the PFD 501 will generate a charge down signal D to the charge pump 503. If the phase of the feedback clock lags the phase of the reference clock, the PFD 501 will generate a charge up signal U to the charge pump 503.

In a specific embodiment, the charge pump circuit 503 includes two switches. Upon receiving a charge-up signal U from PFD 501, the charge pump 503 injects a current I into the input node A. Loop filter 505 integrates this charge up current to cause output voltage of the filter at the output node B to go up. If charge pump circuit 503 receives a charge-down signal D from PFD 501, charge pump 503 discharges a current I from the input node A. Loop filter 505 then integrates this charge down current to cause output voltage of the filter at the output node B to go down.

Voltage control oscillator VCO 507 receives the output voltage signal from the loop filter 505 and generates an output clock CLKFB signal. The frequency of this clock CLKFB signal is then divided down by the frequency divider FD circuit 509 with a preset value. Correspondingly, an output clock signal of the FD 509 is then sent to back the PFD circuit 501 as a feedback clock signal with zero location shifted. Through the feedback mechanism, the external reference clock and the feedback clock can be synchronized.

Figure 7:
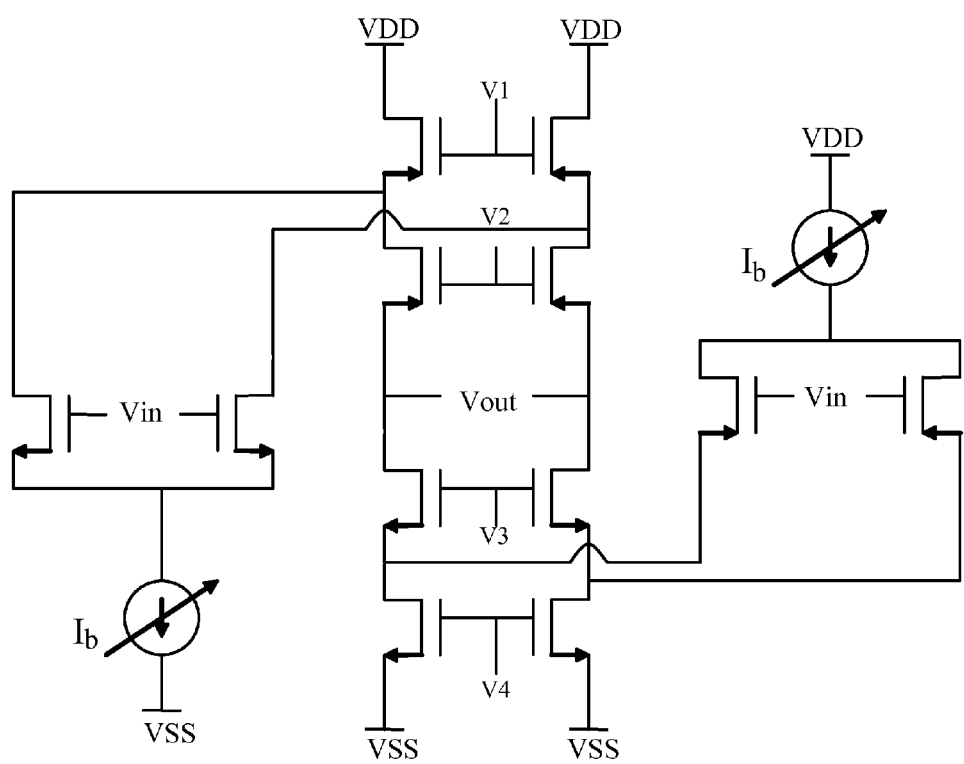
FIG. 7 is a circuit diagram of a folded-cascode amplifier used in a PLL loop filter according to an embodiment of the present invention.

In an specific embodiment, the loop filter 505 includes a zero point circuit made by at least two resistors 511 and 512, and a capacitor 522 as shown in FIG. 4. In another specific embodiment, when the charge pump 503 charges up the input node A, driving up the output of the amplifier K1. This makes the voltage difference across the resistor 511 to decrease. Current flowing through the resistor 511 thus decreases. This effectively changes the zero frequency location in the loop filter. If the charge pump 503 discharges the input node A, the reverse effect occurs and an effective value of resistor 511 still increases. A gain parameter of the amplifier K1 tunes the zero frequency according to different value of the gain. As described in a later section of this specification, the gain parameter of the amplifier is controlled by an internal adjustable bias current $I_b$ inside the amplifier K1, as shown as an example in FIG. 7 in later section of the specification. The effective value of resistor 511 can be increased by the gain of the amplifier K1. In yet another specific embodiment, the amplifier K1 is designated as a two-input differential amplifier. Therefore, the gain of the amplifier can easily exceed 40 dB, while the gain of a convention single-input amplifier K (as shown in FIG. 3A) is in general at about 20 dB. In an example, the amplifier K1 can be constructed as a folded-cascode amplifier (FIG. 7). This kind of amplifier can work for any input DC voltage. The much larger gain associated with the amplifier K1 in the current invention is one of many advantages over the conventional PLL circuits.

Figure 1:
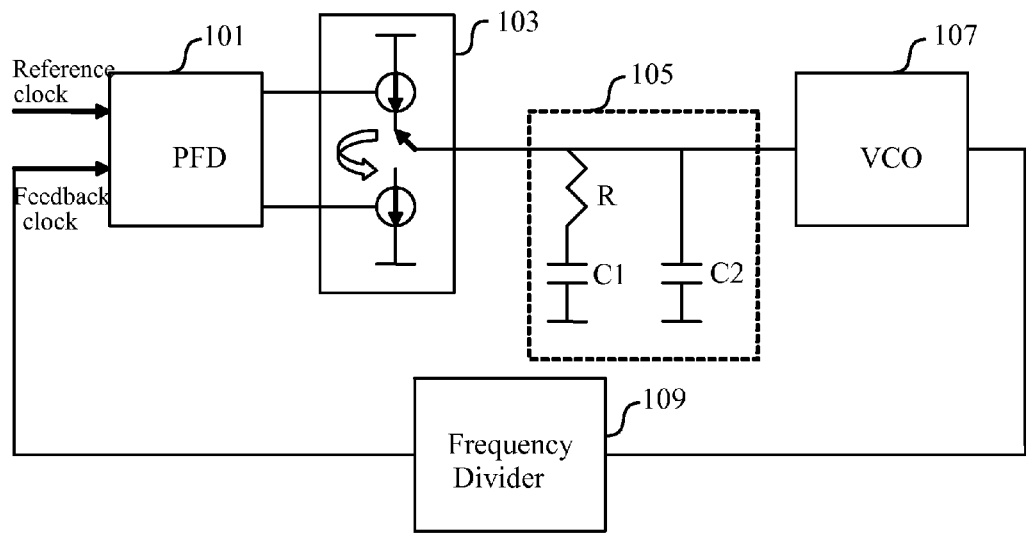
FIG. 1 is a conventional circuit diagram of a standard second order low pass loop filter used in a PLL circuit.
Figure 4A:
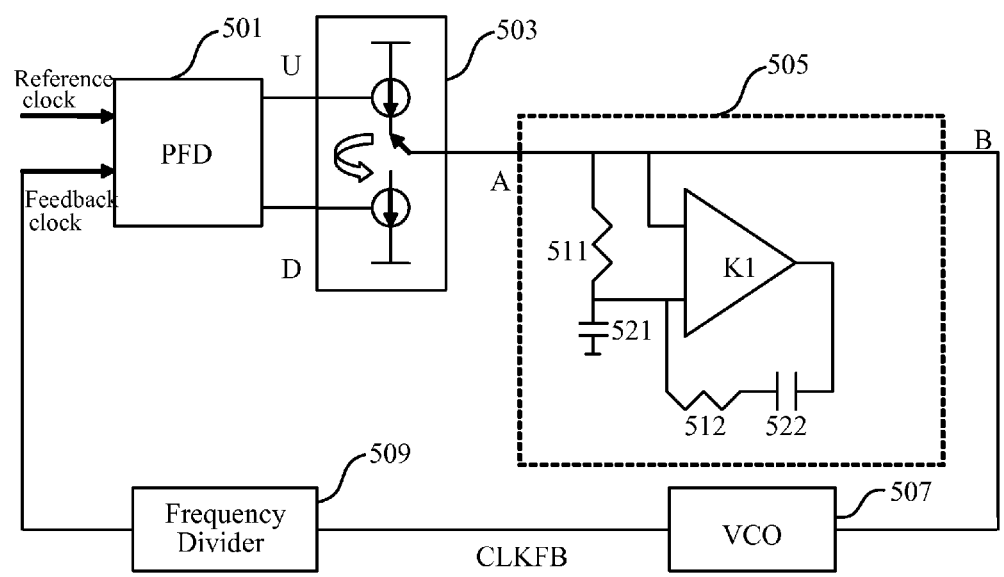
FIGS. 4A, 4B, and 4C are circuit diagrams of a PLL circuit with tunable zero frequency in a loop filter according to alternative embodiments of the present invention.
Figure 4B:
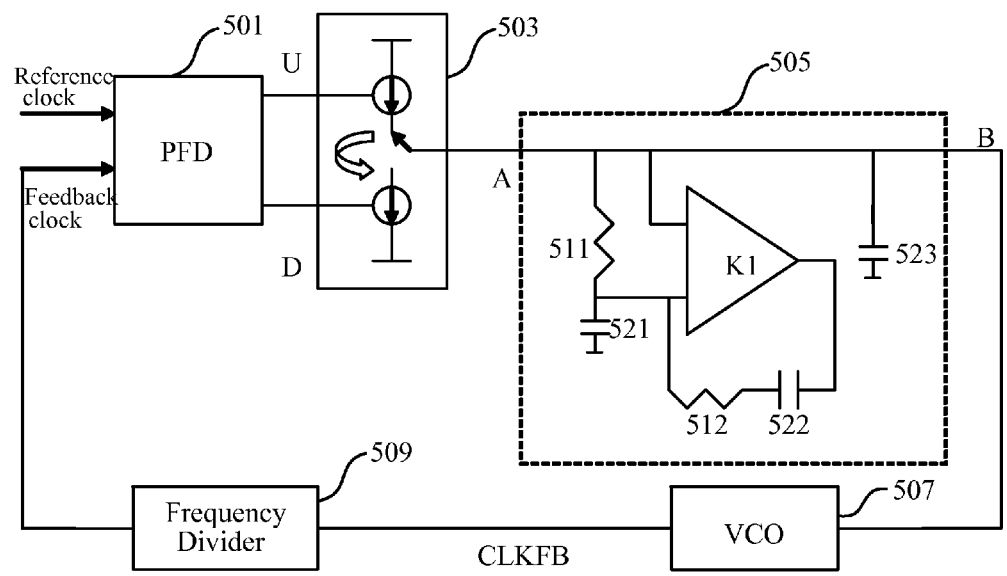
Figure 4C:
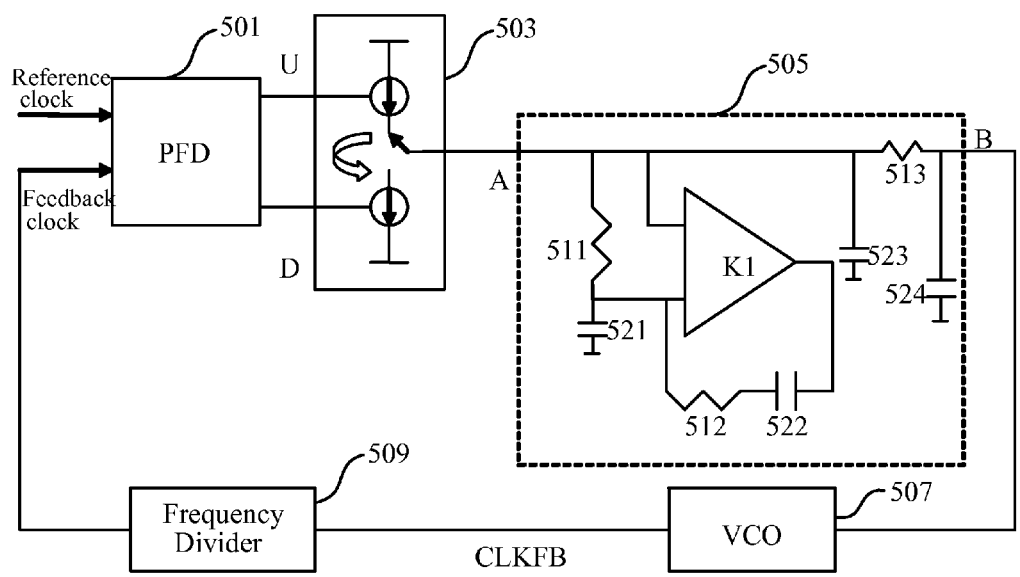

The traditional loop filter 105 shown in FIG. 1 may be called a second order loop filter. The function of the resistors 511, 512 and capacitor 522 is to provide a zero frequency in the phase transfer function of the system to increase the phase margin. The present invention is not limited to either a first order loop system or a higher order loop system. FIGS. 4A, 4B, and 4C are circuit diagrams of a PLL circuit with tunable zero location in a loop filter according alternative embodiments of the present invention. These diagrams are merely examples, which should not unduly limit the scope of the claims herein. One in ordinary skilled of the art should recognize many alternatives, variations, and modifications. In particular, FIG. 4A shows that the loop filter includes an additional capacitor 521 coupled between the resistor 511 and ground. The added capacitor 521 does not change the nature of the loop filter with tunable zero location while does providing a higher order feedback control. Alternatively, FIG. 4B shows that another capacitor 523 is further added to couple between the output node B and ground. This addition of capacitor 523 makes the loop filter 505 a second order loop filter. In another alternative embodiment, FIG. 4C shows that addition resistor 513 is added to couple the previous capacitor 521 and the output node B and a capacitor 524 is attached between the output node B and the ground, making the loop filter 505 a third order loop filter. Of course, there are other variations, alternatives, and modifications in the arrangement of those resistor and capacitor components to maintain the same functionality of tunable zero loop filter while providing different orders in feedback control depending on embodiments. The four loop filters structures disclosed above are merely examples. Embodiments of the present invention are not limited thereto. Any method that is using a differential input amplifier in a loop filter of any order to modify the zero frequency of the PLL circuit falls within the scope of the present invention.

Figure 5A:
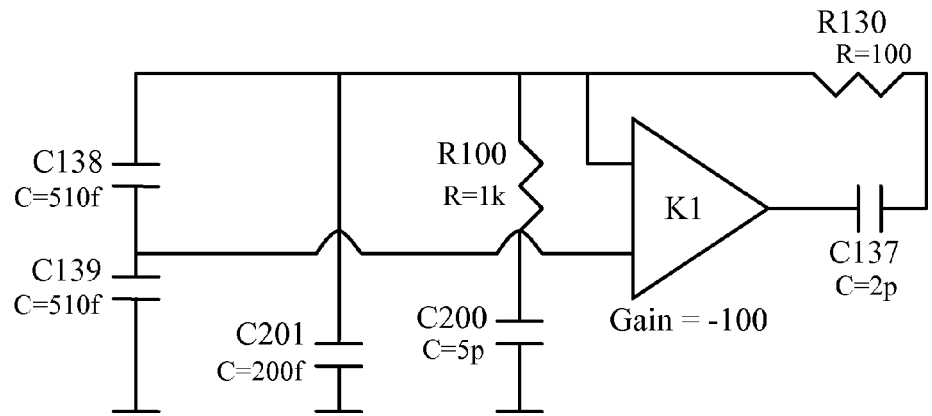
FIG. 5A is a circuit diagram illustrating a pole location being shifted by an amplifier, a resistor, and a capacitor according to another embodiment of the present invention.

In an alternative embodiment of the present invention for tuning pole location of the loop filter is shown in FIG. 5A. In an embodiment of the present invention, the concept of adjusting pole in FIG. 5A is that by combining an OpAmp and C137 the low pass filter is able to detect another branch that has a Miller effect configuration. The Miller effect combines with the low pass filter to make an adjustable pole shifting effect. By adding a feedback OpAmp and a capacitor C137, the effective capacitance of the original low pass filter becomes C200+A/2×C137, where parameter A is the amplifier gain. Thus, the pole location can be adjusted by the amplifier gain. In FIG. 5A the value of capacitor C138 is set to equal to capacitor C139. If a ratio of these two capacitors changes, the value of A/2 factor also changes. Bandwidth of the PLL circuit also is changed subsequently. In general, the bigger the effective capacitance is, the smaller the bandwidth is.

Figure 1A:
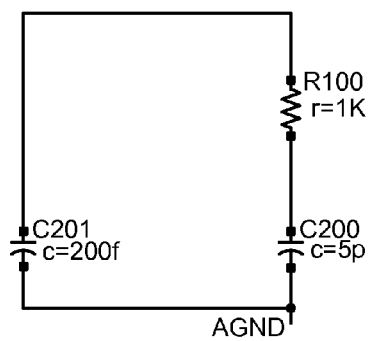
FIG. 1A is an exemplary implementation of the loop filter used in the PLL circuit in FIG. 1.
Figure 2:
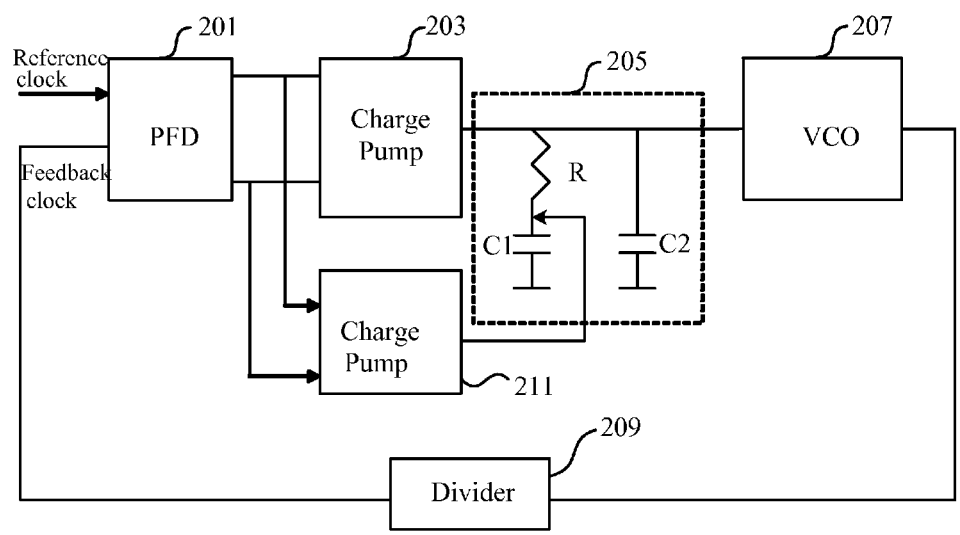
FIG. 2 is an improved version of a PLL circuit with a standard second order low pass filter.
Figure 5B:
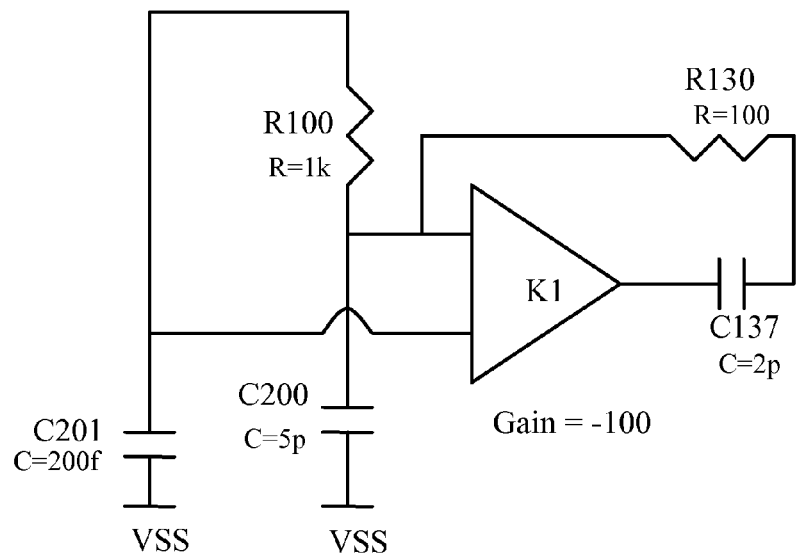
FIG. 5B is a circuit diagram illustrating a zero location being shifted by an amplifier, a resistor, and a capacitor according to another embodiment of the present invention.

In another example, FIG. 5B shows the shifting of the zero location in the loop filter. In another embodiment of the present invention, the concept of adjusting zero in FIG. 5B is that by combining an OpAmp and C137 it provides an injecting current which reduces the voltage difference that was measurable by R100 during each charge pump cycle. In the original low pass filter (FIG. 1A), the zero locates at 1/(R100× C200). The new zero location in FIG. 5B becomes 1/(R100× (C200+A×C137)). This gives IC chip designers the freedom to choose a smaller capacitor C200 and resistor R100 to reduce on-die real estate.

Figure 5C:
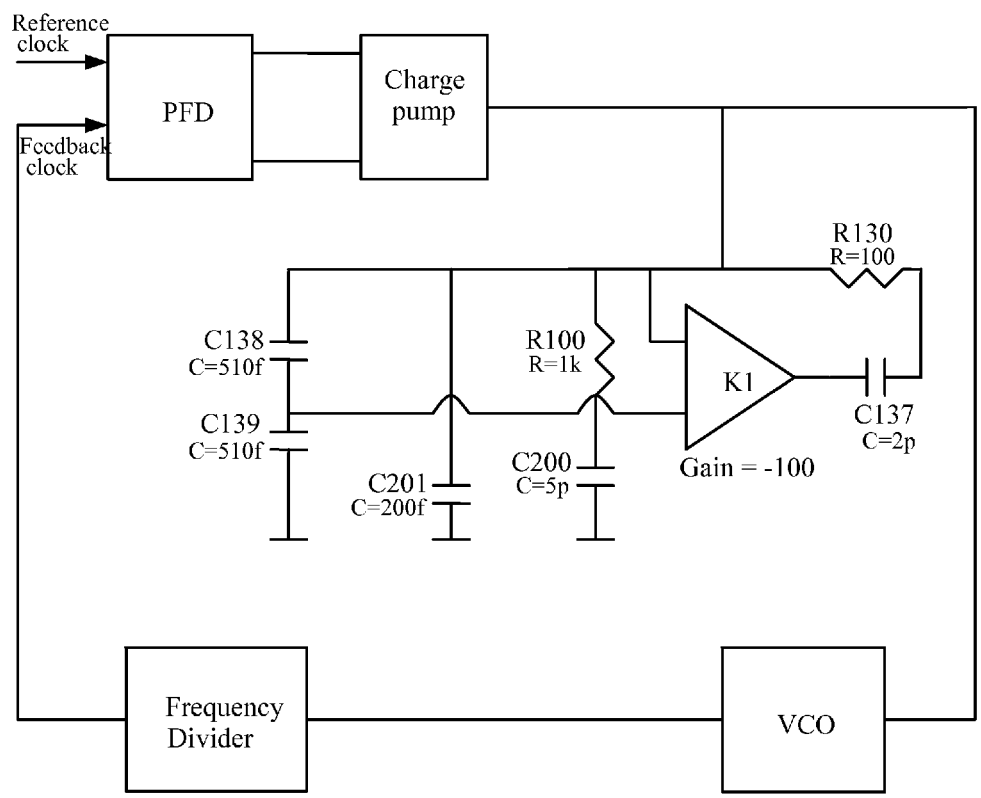
FIG. 5C is a circuit diagram of an adjustable pole-shifting phase lock loop with reduced on-die capacitance according to another embodiment of the present invention.

According to an embodiment of the present invention, as shown in FIG. 5C, the capacitor used in the loop filter can be much smaller for achieving a lower PLL bandwidth than the capacitor used in conventional methods.

Figure 6:
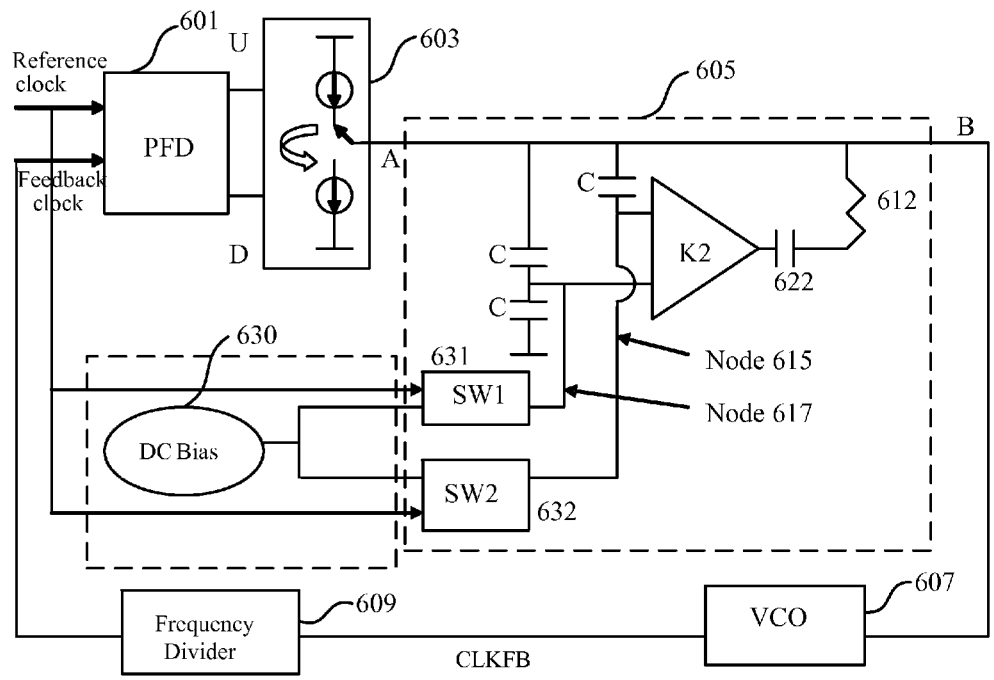
FIG. 6 is a circuit diagram of a PLL circuit with tunable pole frequency in a loop filter according to an embodiment of the present invention.

FIG. 6 is a circuit diagram of a PLL circuit with tunable pole frequency in a loop filter according to an embodiment of the present invention. This diagram is merely an example, which should not unduly limit the scope of the claims herein. One in ordinary skilled of the art should recognize many alternatives, variations, and modifications. According to the embodiment of the present invention, a loop filter 605 is provided in a PLL circuit shown in FIG. 6. As shown, a phase-frequency detector PFD 601 receives an external reference clock and a feedback clock. PFD 601 compares the two signals and then sends out an output signal to the charge pump circuit 603. If the phase of the feedback clock leads the phase of the reference clock, the PFD generates a charge down signal D to the charge pump 603. If phase of the feedback clock lags the phase of the reference clock, the PFD generates a charge up signal U to the charge pump 603.

During an operation of the PLL circuit, the charge pump 603 either charges up or charges down (of a current signal) to the input node A of the loop filter 605. An output voltage signal of the loop filter 605 at output node B is coupled to a voltage control oscillator VCO 607. Subsequently, an output signal of the VCO 607 is coupled to a frequency divider FD 609 which generates an output signal by dividing the output signal of VCO 607 and sent the output signal as a feedback clock back to the PFD 601.

In a specific embodiment, the loop filter 605 is configured to include a resistor 612, a capacitor 622, three capacitors, which can be of same size and same capacitance value C (though not necessary), a two-input differential amplifier K2, a first switch 631, a second switch 632, and a DC bias circuit 630. The capacitor 622 forms the dominant pole of the loop circuit. The resistor 612 and the capacitor 622 decide the zero frequency. The amplifier K2 combines the capacitor 622, and the resistor 612 to form a feedback circuit configured to shift pole location by changing the gain of the amplifier K2. Due to the Miller effect, an effective capacitance value of the capacitor 622 can be magnified by the gain of the amplifier K2.

Figure 6A:
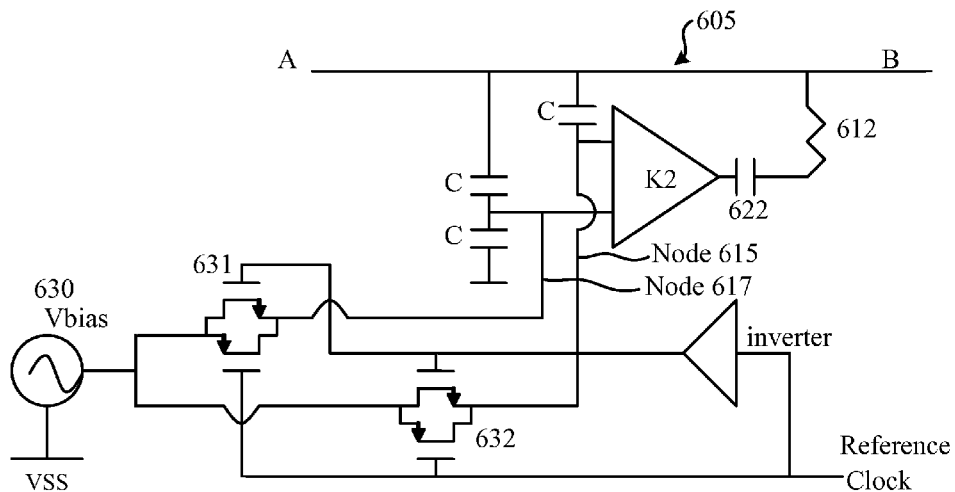
FIGS. 6A, 6B, and 6C are circuit diagrams of a loop filter in FIG. 6 according to alternative embodiments of the present invention.

A detailed implementation of the loop filter 605 is illustrated in a circuit diagram shown in FIG. 6A. The amplifier K2 is a differential amplifier with two input terminals and one output terminal. The two input terminals correspond to Node 615 and Node 617, respectively. The output terminal couples to the capacitor 622. DC bias of the two input terminals are set up by the two switches, 631 and 632, and a DC bias circuit 630. During circuit operation, the DC bias voltage of the two amplifier inputs remains the same, and will not be changed even the charge pump output DC voltage varies. The two switches turn on when the reference clock is at ground voltage. When the reference clock is at high voltage, both switches turn off. This allows the amplifier K2 to operate in a fixed DC operating point. Further, the gain of the amplifier K2 can easily reach as large as 40 dB to 80 dB. The AC input signals for the amplifier K2 is coupled from the three same-value capacitors with same capacitance C, which connect to the output terminal of the charge pump 603. The amplifier K2 and capacitor 622 are characterized to be a Miller capacitor. This can effectively increase the capacitor value by the gain of the amplifier, thus reducing the bandwidth of the PLL circuit. More detailed descriptions about functions of a PLL circuit having the loop filter with tunable pole according to embodiments of the present invention can be found throughout the specification and particularly below.

Referring to FIG. 6, during an operation of the PLL circuit the phase frequency detector 601 compares an external reference clock and the feedback clock. If the phase of the feedback clock leads the phase of the reference clock, the PFD generates a charge down signal D to the charge pump 603. If the phase of the feedback clock lags the phase of the reference clock, the PFD generates a charge up signal U to the charge pump 603.

Charge pump circuit 603 includes two switches. When a charge up signal U from PFD 601 is received, charge pump 603 injects a current I into the input node A. Loop filter 605 then integrates this charge up current I, and an output voltage formed by the loop filter 605 at the input node B goes up. If charge pump circuit 603 receives a charge down signal D from PFD 601, charge pump discharges a current I from the input node A. Loop filter 605 then integrates this charge down current, and the output voltage formed by the loop filter 605 at the output node B goes down.

Voltage control oscillator 607 couples to the output node B to receive the output voltage from the loop filter 605 and to generate an output clock CLKFB signal. The frequency of this clock CLKFB signal is then divided down by the frequency divider circuit 609 with a preset value. Output clock signal of the frequency divider 609 including information of a shifted pole location is then sent back to the PFD circuit 601. Through the feedback mechanism, the external reference clock and the feedback clock can be synchronized.

Figure 6B:
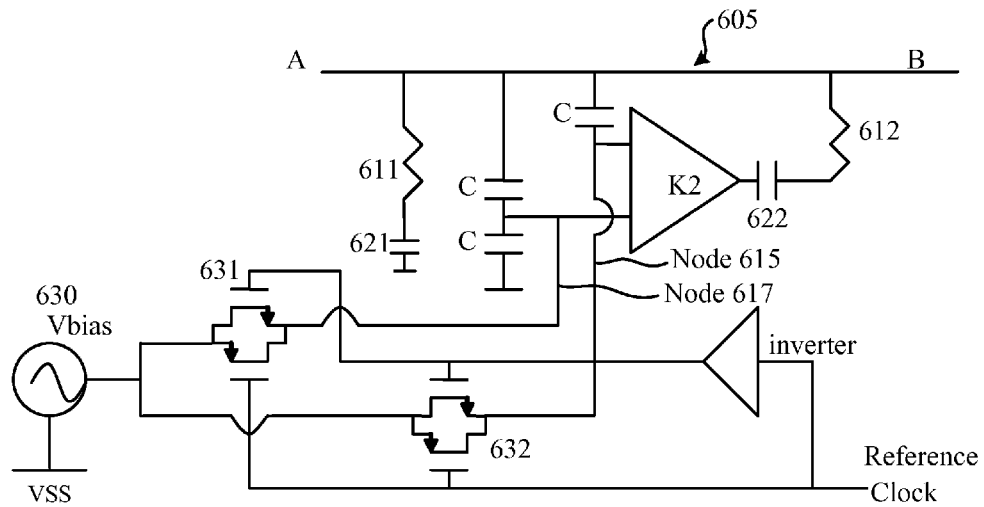

In FIG. 6B, a resistor 611 and a capacitor 621 is added in the loop filter 605 forming a zero frequency and also a pole frequency in the PLL transfer function. The value C1 of the capacitor 621 affects the open loop phase gain and bandwidth of the system. In an embodiment of the present invention, the amplifier K2, resistor 612 and capacitor 622 are configured to modify the original PLL bandwidth determined by the resistor 611 and the capacitor 621. If the resistor 611 and the capacitor 621 are omitted, the resistor 612 and the capacitor 622 become the dominant pole and zero. The effective capacitor value C2 of the capacitor 622 is magnified by the gain of the amplifier K2, where the gain of the amplifier is adjustable by changing it's internal DC bias current $I_b$, as shown as an example in FIG. 7. The amplifier K2 is called a folded-cascode amplifier or a two-input differential amplifier.

During an operation of the PLL circuit, as shown in FIG. 6, when the charge pump 603 charges up a current signal at the input node A, a voltage signal at the node A goes up and an output of the amplifier K2 goes down. This makes the effective capacitor value C2 of the capacitor 622 been magnified by the gain of the amplifier. As a result, an open loop phase gain decreases and the bandwidth of the PLL circuit is then shifted to a lower frequency. If the charge pump 603 discharges the node A, the output voltage at the output of the amplifier K2 goes up to achieve the same effect on the capacitor 622.

When an external clock and a feedback clock are at close frequency and phase stage, the charge pump 603 only gives a short pulse at the rising edge of the reference clock. When the reference clock is at logic high state, the two switches 631 and 632 are turned off. The PFD 601 evaluates the incoming signals and sends an output signal to the charge pump 603. The charge pump 603 either charges up or charges down node A. The amplifier K2 receives differential input signals from two AC coupled capacitors. Capacitor 622, resistor 612 and amplifier K2 are configured to form a feedback loop and change the PLL bandwidth to a lower frequency comparing to the original bandwidth determined by the capacitor 621 and the resistor 611. The gain of the amplifier K2 is controlled by the amplifier internal bias current. When the reference clock goes to logic low, the charge pump 603 does not inject any current into node A. The two switches 631 and 632, which can be identical, are turned on to setup the DC bias point at the two input nodes of the amplifier. The two amplifier inputs, node 615 and node 617, are charged up to the fixed external DC bias voltage supply 613. When the reference clock is at logic low state, the PFD 601 does not evaluate the feedback signal and the reference clock signal.

Figure 3:
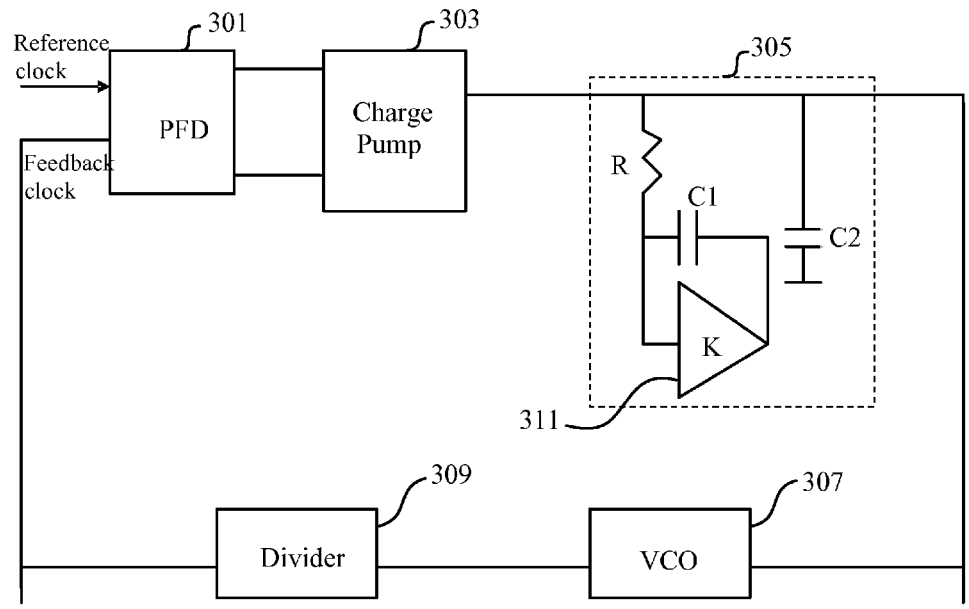
FIG. 3 is another improved version of a PLL circuit with a Miller-effect loop filter including a single-input amplifier.
Figure 3A:
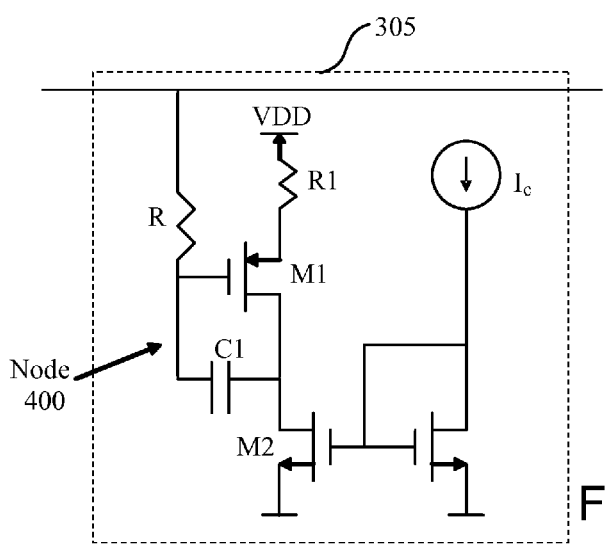
FIG. 3A is an exemplary implementation of the loop filter used in the PLL circuit in FIG. 3.

Due to the fact that the amplifier K2 is a two-input differential amplifier, the gain of the amplifier K2 can easily exceed 40 dB, where the gain of a single-input amplifier as shown in FIG. 3 is in general at about 20 dB or less. Also in certain embodiments of the present invention, the input DC value of the amplifier K2 does not vary with the loop filter DC voltage. It is configured to stay in a fixed value.

Figure 6C:
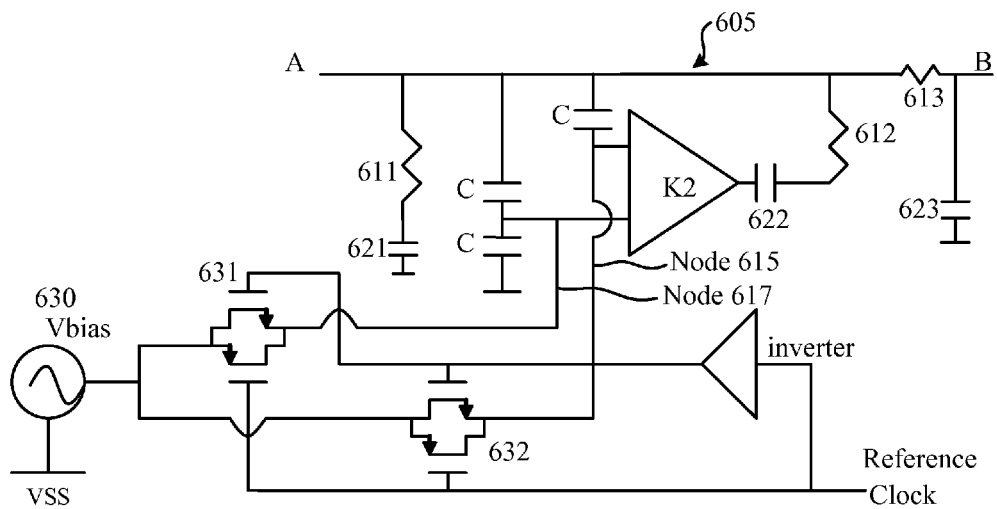

Two other optional circuit layouts are shown in FIG. 6B and FIG. 6C, with some additional resistor and capacitor components added without changing the main function of the loop filter 605 for tuning pole location and enhanced signal synchronization stability. Embodiments of the present invention are not limited thereto. Any method that is using AC coupled differential input amplifier to modify the bandwidth of the PLL circuit should fall within the scope of the present invention.

Bandwidth of a PLL circuit is an important design parameter, and there are many factors that affect the bandwidth of the circuit. One of the parameters that play an important role is the value of the capacitor used in the loop filter. If a low bandwidth PLL circuit is desired, a big capacitor is necessary. In the present invention, bandwidth of the PLL circuit can be lowered down at least two orders of magnitude comparing with the traditional method. For example, a ring type based PLL in general has a bandwidth frequency around a few Mega Hertz. Using the loop filter provided according to embodiments of the present invention, as shown in FIGS. 6, 6A, 6B, and 6C, the bandwidth frequency can be easily reduced from a few Mega Hertz range to around 10K to 100K Hertz range. Additionally, the loop filter can be integrated without a need of a huge external surface-mounted capacitor component as it is used in traditional PLL circuit.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A loop filter having an input node and an output node, the loop filter comprising:
a first resistor connected to the input node;
a first capacitor coupled to the output node through the first resistor;
a second capacitor coupled to the input node;
a third capacitor coupled to the input node;
an amplifier with a gain, comprising a first input terminal, a second input terminal, and an output terminal, wherein the first input terminal is coupled to the input node through the second capacitor, the second input terminal is coupled to the input node through the third capacitor, and the output terminal is coupled to the first capacitor;
a fourth capacitor coupled to the second input terminal of the amplifier and ground;
an inverter having an input port and output port, the input port being coupled to a reference clock;
a first NMOS transistor, a first source/drain port of the NMOS transistor being connected to an external DC bias voltage, a second source/drain port of the NMOS being connected to the first input terminal of the amplifier, a gate port of the NMOS transistor being connected to the output port of the inverter;
a first PMOS transistor, a first source/drain port of the PMOS transistor being connected to the external DC bias voltage, a second source/drain port of the PMOS being connected to the first input terminal of the amplifier, a gate port of the PMOS transistor being connected to the reference clock;
a second NMOS transistor, a first source/drain port of the NMOS transistor being connected to the external DC bias voltage, a second source/drain port of the NMOS being connected to the second input terminal of the amplifier, a gate port of the NMOS transistor being connected to the output port of the inverter; and
a second PMOS transistor, a first source/drain port of the PMOS transistor being connected to the external DC bias voltage, a second source/drain port of the PMOS being connected to the second input terminal of the amplifier, a gate port of the PMOS transistor being connected to the reference clock.

2. The loop filter of claim 1 further comprising:
a second resistor; and
a fifth capacitor coupled to ground and the input node through the second resistor.

3. The loop filter of claim 2 further comprising:
a third resistor connected between the input node and the output node; and
a sixth capacitor coupled between the output node and ground.

4. A phase lock loop circuit, comprising:
a phase frequency detector circuit having a first port configured to receive an first clock signal and a second port configured to receive a second clock signal, the phase frequency detector circuit being configured to compare the first clock signal with the second clock signal to generate a comparing result signal;
a charge pump circuit configured to receive the comparing result signal and generate a current signal;
a loop filter coupled to the charge pump having an input node for receiving the current signal and an output node for outputting a voltage signal, wherein the loop filter comprising:

a first resistor connected to the input node;
a first capacitor coupled to the output node through the first resistor;
a second capacitor coupled to the input node;
a third capacitor coupled to the input node;
an amplifier with a gain parameter, comprising a first input terminal, a second input terminal, and an output terminal, wherein the first input terminal is coupled to the input node through the second capacitor, the second input terminal is coupled to the input node through the third capacitor, and the output terminal is coupled to the first capacitor;
a fourth capacitor coupled to the second input terminal of the amplifier and ground;
an inverter having an input port and an output port, the input port being coupled to the first clock signal;
a first NMOS transistor, a first source/drain port of the NMOS transistor being connected to an external DC bias voltage, a second source/drain port of the NMOS being connected to the first input terminal of the amplifier, a gate port of the NMOS transistor being connected to the output port of the inverter;
a first PMOS transistor, a first source/drain port of the PMOS transistor being connected to the external DC bias voltage, a second source/drain port of the PMOS being connected to the first input terminal of the amplifier, a gate port of the PMOS transistor being coupled to the first clock signal;
a second NMOS transistor, a first source/drain port of the NMOS transistor being connected to the external DC bias voltage, a second source/drain port of the NMOS being connected to the second input terminal of the amplifier, a gate port of the NMOS transistor being connected to the output port of the inverter; and
a second PMOS transistor, a first source/drain port of the PMOS transistor being connected to the external DC bias voltage, a second source/drain port of the PMOS being connected to the second input terminal of the amplifier, a gate port of the PMOS transistor being coupled to the first clock signal;

a voltage controlled oscillator coupled to the output node of the loop filter for generating a third clock signal according to the voltage signal from the loop filter, and
a frequency divider coupled to the voltage controlled oscillator for dividing the third clock signal and generating a fourth clock signal, the fourth clock signal being sent to the second port of the phase frequency detector circuit.

5. The phase lock loop circuit of claim 4 wherein the first clock signal is an external reference clock, the second clock signal is a feedback clock signal substantially the same as the fourth clock signal.

6. The phase lock loop circuit of claim 4 wherein the loop filter further comprises a second resistor and a fifth capacitor coupled to ground and the input node through the second resistor.

7. The phase lock loop circuit of claim 6 wherein the loop filter further comprises a third resistor connected between the input node and the output node and a sixth capacitor coupled between the output node and ground.

8. The phase lock loop circuit of claim 4 wherein the loop filter provides a feedback mechanism to adjust pole location in the loop filter through the fourth clock signal sent back to the phase frequency detector circuit.

9. The phase lock loop circuit of claim 8 wherein the feedback mechanism comprises a means for reducing bandwidth by at least two orders of magnitude.

10. The phase lock loop circuit of claim 8 wherein the feedback mechanism comprises a means for adjusting the bandwidth to a very low frequency without need a substantially large external surface-mounted capacitor.

11. The phase lock loop circuit of claim 10 wherein the very low frequency associated with the phase lock loop circuit is ranged from 1 kHz to 100 kHz reduced from 1 MHz range.

12. The phase lock loop circuit of claim 8 wherein the pole location is adjusted by the gain parameter of the amplifier, the gain parameter being as large as 40 dB to 80 dB.

* * * * *